United States Patent
Takeda

(10) Patent No.: US 9,595,842 B2
(45) Date of Patent: Mar. 14, 2017

(54) ELECTRICITY STORAGE SYSTEM

(71) Applicant: Hitachi, Ltd., Chiyoda-ku, Tokyo (JP)

(72) Inventor: Kenji Takeda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 129 days.

(21) Appl. No.: 14/652,606

(22) PCT Filed: Dec. 20, 2012

(86) PCT No.: PCT/JP2012/083000
§ 371 (c)(1),
(2) Date: Jun. 16, 2015

(87) PCT Pub. No.: WO2014/097435
PCT Pub. Date: Jun. 26, 2014

(65) Prior Publication Data
US 2015/0333550 A1 Nov. 19, 2015

(51) Int. Cl.
*H02J 7/00* (2006.01)
*G01R 31/36* (2006.01)
(Continued)

(52) U.S. Cl.
CPC ........ *H02J 7/0052* (2013.01); *G01R 31/3606* (2013.01); *H01M 10/44* (2013.01);
(Continued)

(58) Field of Classification Search
CPC ................ Y02E 60/12; H02J 2007/004; H02J 2007/0037; H01M 10/48
(Continued)

(56) References Cited

U.S. PATENT DOCUMENTS

2004/0113585 A1* 6/2004 Stanesti ................ H02J 7/0018
320/116
2005/0248314 A1* 11/2005 James ................ G01R 31/3648
320/131
(Continued)

FOREIGN PATENT DOCUMENTS

JP   8-223808 A    8/1996
JP   2000-36320 A   2/2000
(Continued)

OTHER PUBLICATIONS

International Search Report (PCT/ISA/210) dated Mar. 12, 2013 with English-language translation (four (4) pages).
(Continued)

*Primary Examiner* — Arun Williams
(74) *Attorney, Agent, or Firm* — Crowell & Moring LLP

(57) ABSTRACT

In a system having a plurality of storage batteries equipped with bidirectional invertors respectively, the present invention allows a new storage battery to be easily attached later with a structure in which an inverter control is performed according to a value detected in another storage battery. An electricity storage system of the present invention includes: a current detector (22) that detects a charging/discharging current or charging/discharging power of a first electricity storage system (10) directly or indirectly; a second bidirectional inverter (23) that performs power conversion when charge/discharge of a second storage battery (21) is performed from/to a power system (30); and a control device that controls driving the second bidirectional inverter (23) so as to compensate for charge/discharge of a first storage battery (11) in response to a detected value of the current detector (22).

4 Claims, 10 Drawing Sheets

(51) Int. Cl.
*H01M 10/44* (2006.01)
*H02J 3/32* (2006.01)

(52) U.S. Cl.
CPC .............. *H02J 3/32* (2013.01); *H02J 7/0013* (2013.01); *H02J 7/0068* (2013.01)

(58) Field of Classification Search
USPC ......................................................... 320/134
See application file for complete search history.

(56) References Cited

U.S. PATENT DOCUMENTS

| | | | |
|---|---|---|---|
| 2013/0151227 A1* | 6/2013 | Yang .................... | H01M 10/48 703/18 |
| 2013/0207616 A1* | 8/2013 | Shim .................... | H02J 7/0019 320/136 |
| 2013/0257383 A1* | 10/2013 | Shim ........................ | H02J 3/32 320/134 |

FOREIGN PATENT DOCUMENTS

| | | | |
|---|---|---|---|
| JP | 2000-295784 A | 10/2000 |
| JP | 2002-262577 A | 9/2002 |
| JP | 2009-112188 A | 5/2009 |

OTHER PUBLICATIONS

Japanese-language Written Opinion (PCT/ISA/237) dated Mar. 12, 2013 (four (4) pages).

* cited by examiner

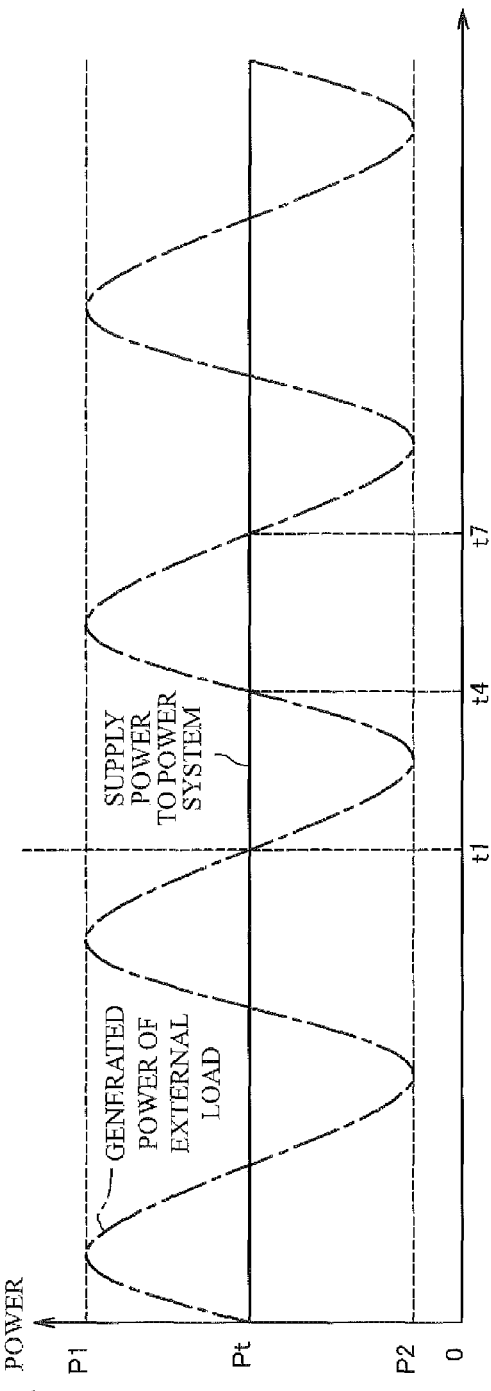
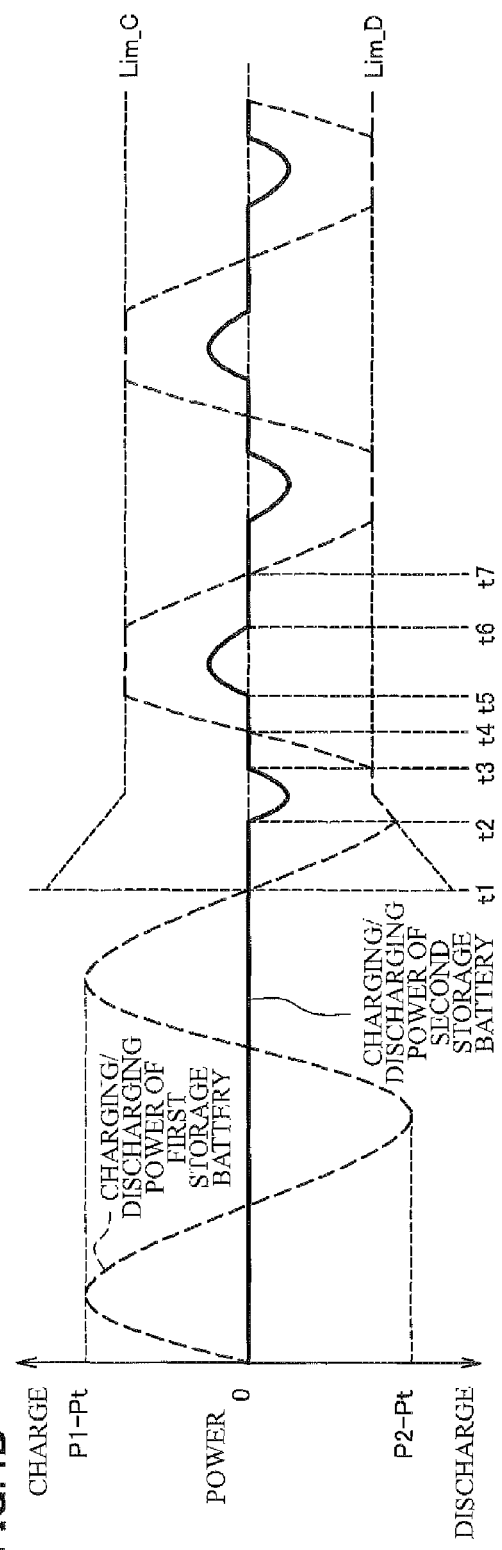

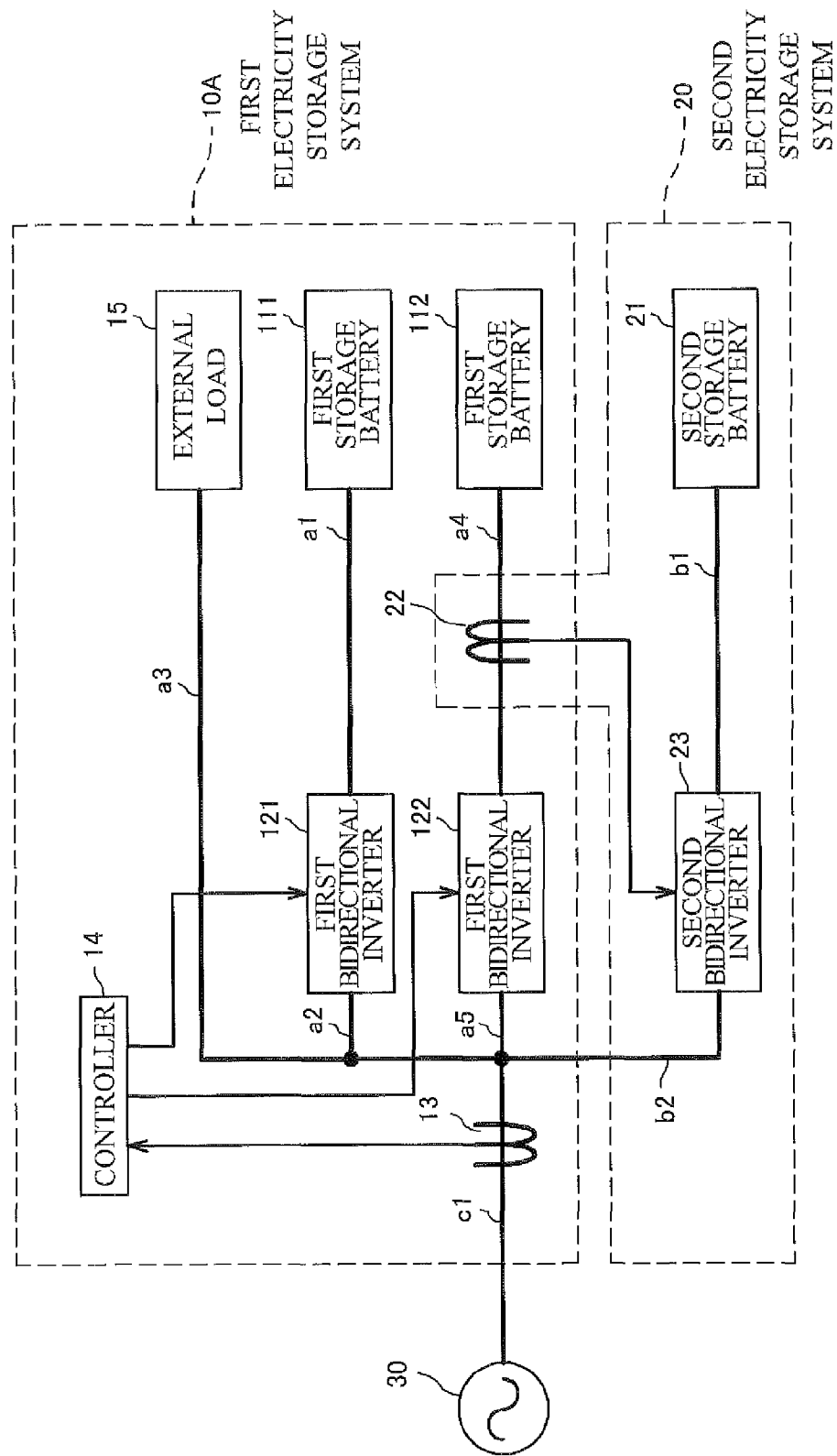

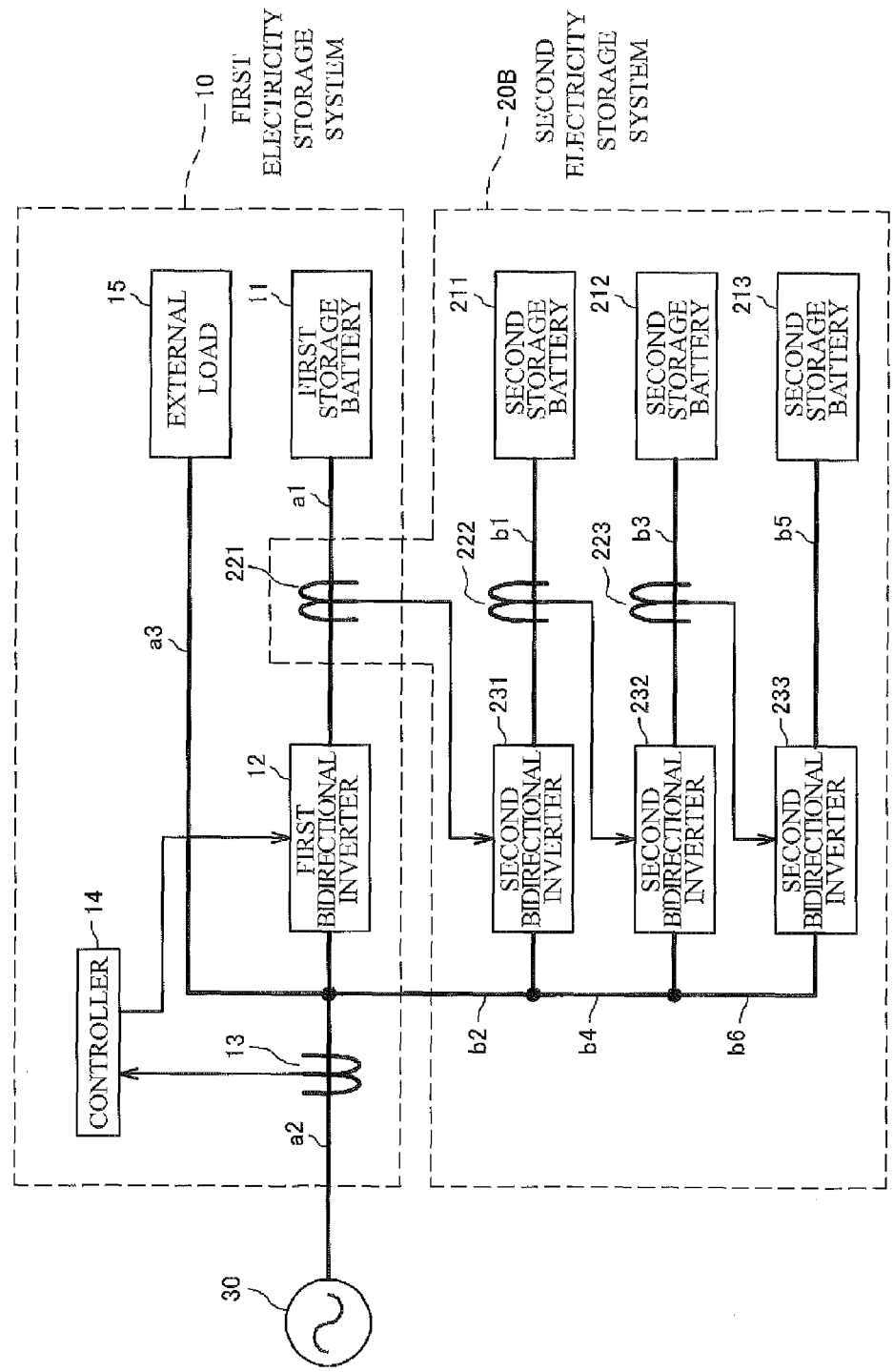

ELECTRICITY STORAGE SYSTEM

TECHNICAL FIELD

The present invention relates to an electricity storage system that charges/discharges storage batteries.

BACKGROUND ART

In recent years, for the purpose of the global environmental protection and effective utilization of energy resources, power generators have been developed that utilize natural energy such as wind power generation and solar power generation. In addition, such an action has been taken by which generated power obtained by utilizing natural energy is purchased by power companies from private companies.

When the wind power generation or the solar power generation is performed, the generated power fluctuates greatly due to natural conditions such as season or weather. Therefore, a large electricity storage system is installed next to the power generator to absorb fluctuations of the generated power described above, which can supply power to a power system stably. In addition, electric power load is leveled by charging storage batteries at night when the load is light on a demand side and discharging the storage batteries in the daytime when the load is heavy on the demand side.

For example, Patent Document 1 discloses a power storage system including a continuous storage battery and an instantaneous storage battery, and controls switching electric power supply to/from respective storage batteries using a common controller and a common bidirectional inverter.

PRIOR ART DOCUMENTS

Patent Documents

Patent Document 1: Japanese Patent Application Publication No. 2000-295784

SUMMARY OF THE INVENTION

Problems to be Solved

In recent years, lithium ion storage batteries have been used in the electricity storage system. Looking back on the past history for product groups of the storage batteries, lead-acid batteries have been exclusively used for the electricity storage system having large capacity in terms of investment effectiveness. Thus, there is a demand that different types of storage batteries (such as lithium ion storage batteries) are retrofitted to an existing electricity storage system including the lead-acid batteries to improve reliability and responsiveness.

However, the power storage system described in Patent Document 1 is configured to control charge/discharge of the two types of storage batteries (the continuous storage battery and the instantaneous storage battery) by a single controller. Then, for example, when the instantaneous storage battery is retrofitted to the existing power storage system including the continuous storage battery, a structure of an entire circuit and algorithm of the controller need to be modified, resulting in taking much time and cost.

The present invention aims to provide an electricity storage system that can retrofit other storage battery easily to an existing system including a storage battery.

Solution to Problems

In order to solve the above problems, the present invention provides an electricity storage system including: a state detection device that detects directly or indirectly a charging/discharging current or charging/discharging power of another electricity storage system connected to a power system; a bidirectional inverter that performs power conversion when charge/discharge of a storage battery managed by the electricity storage system is performed from/to the power system; and a control device that controls driving the bidirectional inverter so as to compensate for charging/discharging the another electricity storage system in response to the charging/discharging current or the charging/discharging power detected by the state detection device.

It is noted that details of the present invention will be described in embodiments of invention.

Advantageous Effects of the Invention

According to the present invention, an electricity storage system can be provided, by which other storage battery can easily be retrofitted to an existing system including a storage battery.

BRIEF DESCRIPTION OF THE DRAWINGS

FIG. 4A is a diagram showing waveforms of temporal changes in a total amount of power supplied to a power system and temporal changes in power outputted from an external load, and FIG. 4B is a diagram showing waveforms of temporal changes in charging/discharging power of a first storage battery and temporal changes in charging/discharging power of a second storage battery;

FIG. 5 is an entire structure diagram showing an overview of the electricity storage system according to a second embodiment of the present invention;

FIG. 6 is an entire structure diagram showing an overview of the electricity storage system according to a third embodiment of the present invention;

EMBODIMENTS OF THE INVENTION

Embodiments for carrying out the present invention (hereinafter, referred to as embodiments) will be described in detail referring to accompanying drawings.

First Embodiment

Figure 1:
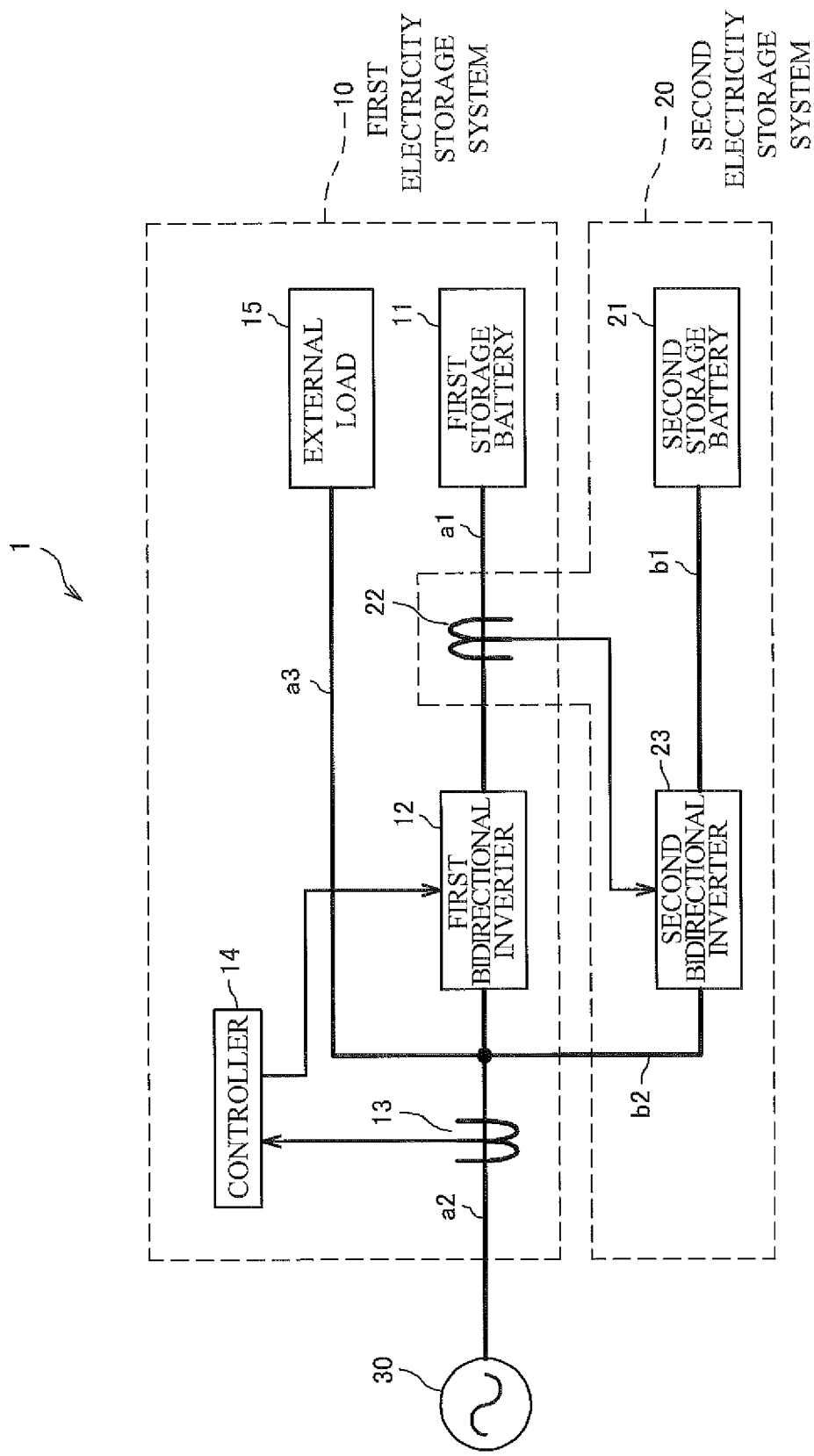
FIG. 1 is an entire structure diagram showing an overview of an electricity storage system according to a first embodiment of the present invention.

FIG. 1 is an entire structure diagram showing an overview of an electricity storage system according to the present invention. In this embodiment, as an example, a case will be described in which an electricity storage system 20 is retrofitted to an existing first electricity storage system 10 connected to a power system 30.

It is noted that, in FIG. 1, a first bidirectional inverter 12 is connected to the power system 30 via a single wiring a2, but in practice, is connected via wirings corresponding to three-phase AC power of U-phase, V-phase and W-phase. The same applies to a wiring b2 that connects a second bidirectional inverter 23 to the power system 30 and to a wiring a3 that connects an external load 15 to the power system 30.

Figure 2:
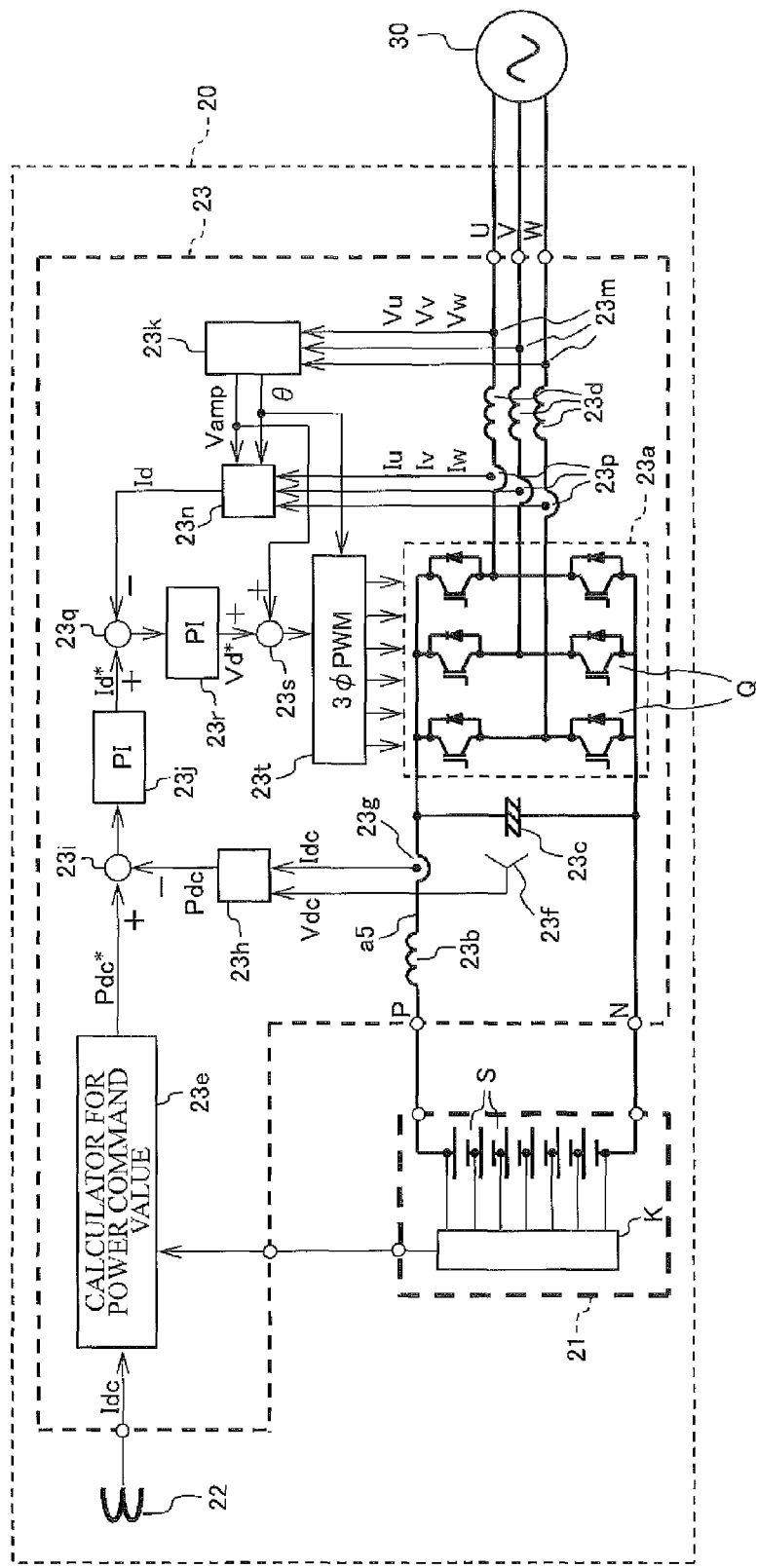
FIG. 2 is a detailed structure diagram of a second electricity storage system.

In addition, in FIG. 1, a first storage battery 11 is connected to the first bidirectional inverter 12 via a single wiring a1, but in practice, the first bidirectional inverter 12 is connected to the first storage battery 11 in parallel at a positive terminal P (see FIG. 2) and a negative terminal N (see FIG. 2). The same applies to a wiring b1 that connects a second storage battery 21 to a second bidirectional inverter 23.

Hereinafter, as an example, a case will be described in which the external load 15 is a generator (such as a wind generator) utilizing natural energy.

Structure of Electricity Storage System

An electricity storage system 1 is a system that absorbs fluctuations of generated power supplied from the external load 15 to the power system 30 by charging/discharging the first storage battery 11 and the second storage battery 21.

As shown in FIG. 1, the electricity storage system 1 includes the existing first electricity storage system 10 connected to the power system 30 and the second electricity storage system 20 retrofitted to the first electricity storage system 10.

First Electricity Storage System

The first electricity storage system 10 (another electricity storage system) includes the first storage battery 11, the first directional inverter 12, a system power meter 13, a controller 14 and the external load 15.

The first storage battery 11 is, for example, a plurality of lead-acid storage batteries connected in series, and is connected to the first bidirectional inverter 12 via the wiring a1. The lead-acid batteries, although being inferior in responsiveness compared with lithium ion storage batteries to be described later, are superior in sustainability and are inexpensive.

The first bidirectional inverter 12 is, for example, a three-phase bidirectional inverter using IGBT (Insulated Gate Bipolar Transistor) of switching elements, and is connected to the power system 30 via the wiring a2. It is noted that the first bidirectional inverter 12 drives in PWM (Pulse Width Modulation) control based on commands from the controller 14.

When the first storage battery 11 is charged, the first bidirectional inverter 12 converts three-phase AC power supplied from the power system 30 via the wiring a2 into DC power, and outputs to the first storage battery 11 via the wiring a1. In this case, the first bidirectional inverter 12 functions as a converter.

On the other hand, when the first storage battery 11 is discharged, the first bidirectional inverter 12 converts DC power discharged from the first storage battery 11 via the wiring a1 into three-phase AC power, and outputs to the power system 30 via the wiring a2. In this case, the first bidirectional inverter 12 functions as an inverter.

The system power meter 13 is a power meter that detects power supplied to the power system 30 from the external load 15 as the generator, and the first storage battery 11 and the second storage battery 21 that absorb the fluctuations in the generated power of the external load 15. As shown in FIG. 1, the system power meter 13 is mounted on the wiring a2 at a point closer to the power system 30 than a connection point between the wiring a3 and the power system 30.

The controller 14 is a device that controls driving the first bidirectional inverter 12 based on the power detected by the system power meter 13, and includes various electronic circuits such as a CPU, a RAM and a ROM.

The controller 14 performs load flow calculation using information inputted from the system power meter 13 to control the charge/discharge of the first storage battery 11 according to a preset program.

As described above, the generated power by the external load 15 (for example, the wind power generator) fluctuates depending on natural conditions such as weather. Therefore, the controller 14 controls driving the first bidirectional inverter 12 so that the power (detected value by the system power meter 13) supplied to the power system 30 is substantially constant in terms of time. That is, the controller 14 controls the charge/discharge of the first storage battery 11 so as to cancel an amount of power fluctuations of the external load 15 as a generator.

Thus, one closed control system is formed by the first storage battery 11, the first bidirectional inverter 12, the system power meter 13 and the controller 14.

The external load 15 is, for example, a generator using the natural energy and is connected to the power system 30 via the wirings a3, a2. Incidentally, the external load 15 may be controlled by a controller (not shown) that exchanges various pieces of information with the controller 14, or the controller 14 may control driving the first bidirectional inverter 12 and the external load 15 integrally.

Second Electricity Storage System

The second electricity storage system 20 (electricity storage system) includes the second storage battery 21, a current detector 22 and the second bidirectional inverter 23.

The second storage battery 21 (storage battery) is, for example, a plurality of lithium ion storage batteries connected in series, and is connected to the second bidirectional inverter 23 via the wiring b1. The lithium ion storage batteries have energy density higher than that of the lead-acid batteries and are superior to the lead-acid battery in responsiveness. Shortly, the lithium ion storage batteries have an output/capacity ratio higher than that of the lead-acid storage batteries.

It is noted that the second storage battery 21 is connected to a cell controller K (see FIG. 2) to monitor voltage, current, temperature and the like of each electric cell S (see FIG. 2) and to equalize the voltage of each electric cell S.

The current detector 22 (state detection device) is mounted on the wiring a1 that connects the first storage battery 11 to the first bidirectional inverter 12. The current detector 22 functions to detect charge current inputted to the first storage battery 11 via the wiring a1 or discharge current outputted from the first storage battery 11 via the wiring a1, and to output the result to a calculator 23e for power command value (see FIG. 2) of the second bidirectional inverter 23.

The second bidirectional inverter 23 (bidirectional inverter) is, for example, a three-phase bidirectional PWM inverter using IGBT of switching elements, and is connected to the power system 30 via the wirings b2, a2. The second bidirectional inverter 23 controls the charge/discharge of the second storage battery 21 based on the current value detected by the current detector 22 to assist the charge/discharge of the first storage battery 11.

That is, when charging current (>0) detected by the current detector 22 is above a threshold Lim_c, the second bidirectional inverter 23 functions to charge an amount of current above the threshold Lim_c to the second storage battery 21. In addition, when discharging current (<0) detected by the current detector 22 is below a threshold Lim_d, the second bidirectional inverter 23 functions to discharge an amount of current below the threshold Lim_d from the second storage battery 21.

It is noted that, though not shown in FIG. 1, the second bidirectional inverter 23 is installed with a "control device" that controls on/off of each switching element.

FIG. 2 is a detailed structure diagram of the second electricity storage system. The second bidirectional inverter 23 is connected on a DC side to a positive electrode and a negative electrode of the second storage battery 21 via terminals P, N, and on an AC side to the power system 30 via terminals U, V and W.

Hereinbelow, a description will be given of the second bidirectional inverter 23 functioning as an inverter to discharge power from the second storage battery 21 to the power system 30 side.

The second bidirectional inverter 23 includes "control devices" such as an inverter circuit 23a, the calculator 23e for power command value, a calculator 23h for charging/discharging power, an extractor 23k for AC voltage information, a calculator 23n for effective current and a three-phase PWM calculator 23t.

The inverter circuit 23a is driven in response to PWM signals inputted from the three-phase PWM calculator 23t. The inverter circuit 23a converts DC power inputted via a filter element formed with a coil 23b and a DC capacitor 23c to the three-phase AC power, and then to output the result to the power system 30 (shortly, discharging the second storage battery 21).

The inverter circuit 23a is, as it is called, a three-phase full-bridge inverter circuit, and has a structure in which two switching elements Q are connected in series as an upper arm and a lower arm, and the upper and lower arms are connected to the DC side in parallel. Three midpoint potentials of respective upper and lower arms are connected to the AC terminals U, V and W via interconnected reactors 23d.

The calculator 23e for power command value calculates, in response to a current value Idc inputted from the current detector 22, a power command value Pdc* which the second storage battery 21 should charge/discharge. This is for the retrofitted second storage battery 21 to assist the charge/discharge of the first storage battery 11. When the charging/discharging current (that is, the current value Idc) of the second storage battery is out of a range between the threshold Lim_c and the threshold Lim_d to be described later, the calculator 23e for power command value functions to calculate the power command value Pdc* corresponding to the current value Idc under PI control.

It is noted that, hereinbelow, the charging current and the charging voltage of the second storage battery 21 are expressed with a positive value and the discharging current and the discharging voltage of the second storage battery 21 are expressed with a negative value.

Figure 3:
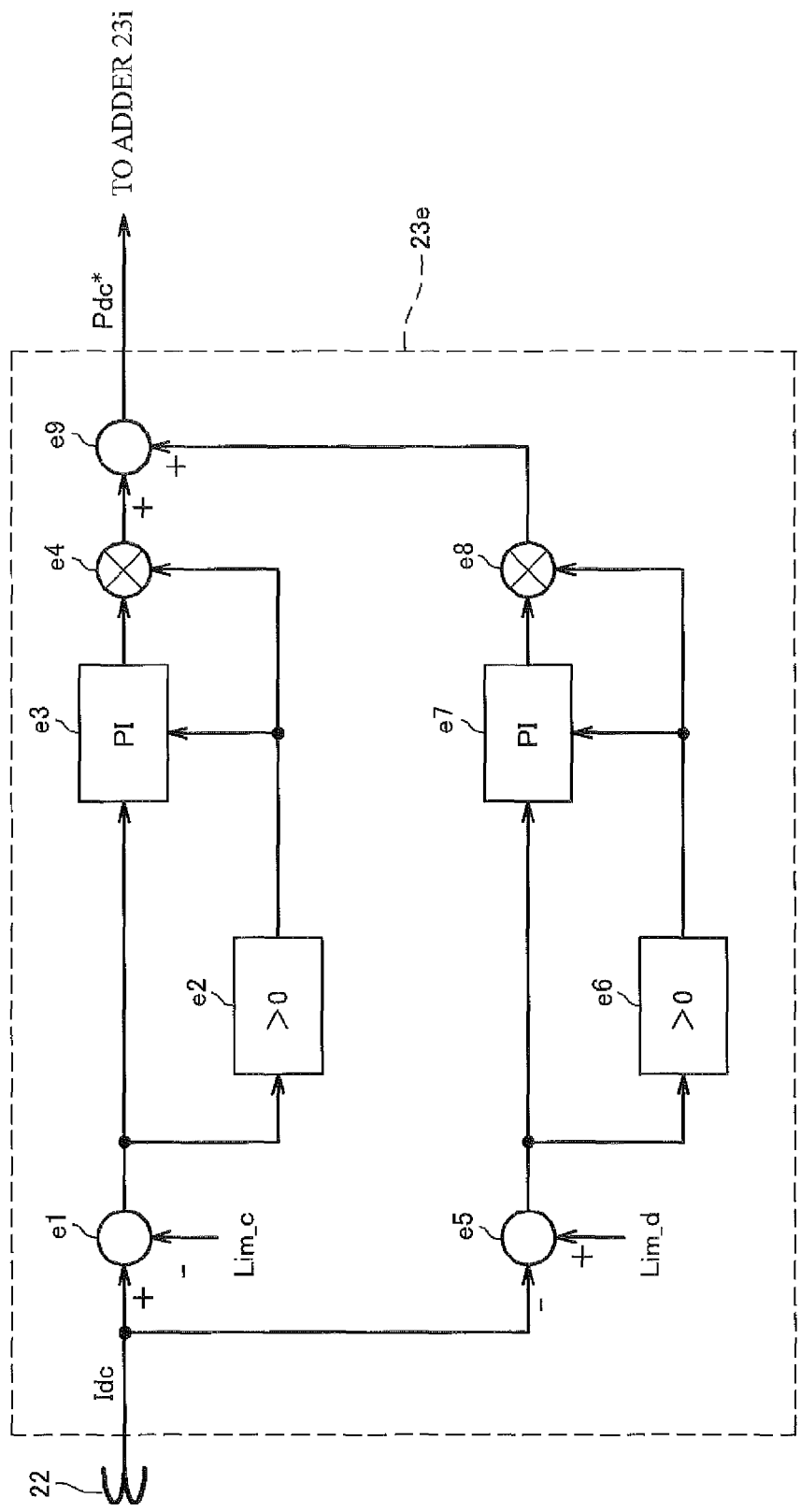
FIG. 3 is a structure diagram of a calculator for power command value included in a second bidirectional inverter.

FIG. 3 is a structure diagram of the calculator for power command value included in the second bidirectional inverter. The calculator 23e for power command value includes adders e1, e5, e9, comparators e2, e6, PI controllers e3, e7, and multipliers e4, e8.

The adder e1 subtracts the threshold Lim_c (>0) from the current value Idc inputted from the current detector 22 and outputs the result to the comparator e2 and the PI controller e3. It is noted that the threshold Lim_c is a reference value used to determine whether the second storage battery 12 should assist to charge the first storage battery 11 and is preset to be stored in a storage device (not shown).

When a current difference (Idc−Lim_c) inputted from the adder e1 is above 0, the comparator e2 outputs '1' to the PI controller e3 and the multiplier e4. On the other hand, when the current difference (Idc−Lim_c) is 0 or below, the comparator e2 outputs '0' to the PI controller e3 and the multiplier e4.

The PI controller e3, using as it is called proportional integral control, calculates the power command value Pdc* to be charged in the second storage battery 21 so as to bring the momently changing current value Idc closer to the threshold Lim_c. It is noted that the PI controller e3 functions to reset the integration operation when the '0' is inputted from the comparator e1 (that is, when the first storage battery 11 does not need to be assisted for charging anymore).

The multiplier e4 multiplies the value ('1' or '0') inputted from the comparator e2 by the power command value inputted from the PI controller e3 to output the result to the adder e9. Shortly, when the current value Idc inputted from the current detector 22 is equal to or below the threshold Lim_c, the multiplier e4 outputs 0 to the adder e9. On the other hand, when the current value Idc inputted from the current detector 22 is above the threshold Lim_c, the multiplier e4 outputs the power command value based on the PI control to the adder e9.

The adder e5 subtracts the current value Idc from the threshold Lim_d (<0) to output to the comparator e6 and the PI controller e7. It is noted that the threshold Lim_d is a reference value used to determine whether the second storage battery 12 should assist to discharge the first storage battery 11, and is preset to be stored in the storage device (not shown)

Incidentally, the smaller the absolute values of the threshold Lim_c, Lim_d are, the greater the extent of the second storage battery 21 assisting the charge/discharge of the first storage battery 11 increases.

Since the comparator e6, the PI controller e7 and the multiplier e8 have the same functions as the above-described comparator e2, the PI controller e3 and the multiplier e4 as described above, explanations therefor will be omitted.

The adder e9 adds a value inputted from the multiplier e4 to a value inputted from the multiplier e8 to output the result to an adder 23i (see FIG. 2). That is, when the charging current of the first storage battery 11 is equal to or below the threshold Lim_c (output of the comparator e2: '0') and is equal to or above the threshold Lim_d (<0) for discharging current of the first storage battery 11 (output of the comparator e6: '0'), the adder e9 outputs 0 as the power command value Pdc*. This corresponds to a case in which the first storage battery 11 does not need to assist to charge/discharge the second storage battery 21.

When the charging current of the first storage battery 11 is above the threshold Lim_c (output of the comparator e2: '1'), the power command value Pdc* calculated by the PI controller e3 is outputted from the adder e9. This corresponds to a case in which the first storage battery 11 assists to charge the second storage battery 21.

When the charging current of the first storage battery 11 is below the threshold Lim_d (<0) (output of the comparator e6: '1'), the power command value Pdc* calculated by the PI controller e7 is outputted from the adder e9. This corresponds to a case in which the first storage battery 11 assists to discharge the second storage battery 21.

The description will be continued again referring back to FIG. 2.

The calculator 23h for charging/discharging power calculates actual charging/discharging power Pdc (DC power) of the second storage battery 21 based on a voltage value Vdc detected by a voltage sensor 23f and the current value Idc detected by a current sensor 23g to output the result to the adder 23i.

It is noted that the voltage sensor 23f is arranged to detect voltage across the DC capacitor 23c. The current sensor 23g is arranged on the wiring a5 between a connection point with the DC capacitor 23c and the coil 23b.

The adder 23i calculates power difference between the power command value Pdc* inputted from the calculator 23e for power command value and the charging/discharging power Pdc inputted from the calculator 23h for charging/discharging power to output the result to a PI controller 23j.

The PI controller 23j calculates a current command value Id* (current value to be outputted from the inverter circuit 23a) using proportional integral control so as to make the power difference inputted from the adder 23i zero, to output the result to the adder 23q.

The extractor 23k for AC voltage information calculates amplitude Vamp of AC voltage Vu, Vv and Vw applied to the terminals U, V and W on the AC side based on the voltage values detected by the three voltage sensors 23m, to output the result to the calculator 23n for effective current and an adder 23s. In addition, the extractor 23k for AC voltage information extracts phases θ of the AC voltage Vu, Vv and Vw based on the voltage value detected by the voltage sensors 23m to output the result to the calculator 23n for effective current and the three-phase PWM controller 23t.

It is noted that the voltage sensors 23m are sensors for detecting the voltage at the terminals U, V and W on the AC side with respect to a grounding point (not shown), and are mounted at a point closer to the power system 30 than the interconnected reactors 23d.

The calculator 23n for effective current calculates effective power based on the amplitude Vamp and the phases θ of the AC voltage Vu, Vv and Vw inputted from the extractor 23k for AC voltage information, and AC current Iu, Iv and Iw inputted from three current sensors 23p. In addition, the calculator 23n for effective current calculates an effective current Id corresponding to the effective power described above, and converts in an orthogonal coordinate system to output the result to an adder 23q.

The adder 23q calculates a current difference between the current command value Id* inputted from the PI controller 23j and the effective current Id inputted from the calculator 23n for effective current to output the result to a PI controller 23r.

The PI controller 23r calculates the voltage command value Vd* using proportional integral control so as to make the power difference inputted from the adder 23q zero to output the result to the adder 23s.

The adder 23s adds the amplitude Vamp of the AC voltage Vu, Vv and Vw inputted from the PI controller 23r to the voltage command value Vd* inputted from the PI controller 23r to output the result to the three-phase PWM controller 23t.

The three-phase PWM controller 23t converts the voltage value inputted from the adder 23s to three-phase AC signals based on the phase θ inputted from the extractor 23k for AC voltage information. In addition, the three-phase PWM controller 23t generates high frequency pulses (rectangular wave voltage) by comparing the three-phase AC signals described above with a predetermined carrier wave (carrier) to control on/off of each switching element Q in response to the pulses. Thus, the operation of the inverter circuit 23a is controlled so as to match the charging/discharging power Pdc of the second storage battery 21 to the power command value Pdc*.

It is noted that a case will not be described where the second bidirectional inverter 23 functions as a converter to charge the second storage battery 21.

Operation of Electricity Storage System

FIG. 4A is a diagram showing waveforms of temporal changes in a total amount of power supplied to the power system and temporal changes in power outputted from the external load. As described above, if the external load 15 is a generator (for example, the wind power generator) using natural energy, the generated power of the external load 15 fluctuates depending on natural conditions such as weather.

The generated power of the external load 15 is, in fact, irregularly varies depending on weather or the like. However, in FIG. 4A, the generated power is schematically shown to fluctuate in a sinusoidal shape (dot and dash line). It is noted that the waveform of the dot and dash line shown in FIG. 4A does not mean instantaneous values (for example, a sine wave at 60 Hz) of the AC power.

In addition, a total amount (solid line) of power supplied to the power system 30 is substantially constant in terms of time and is equal to target power Pt. This is because an amount of the fluctuations in the generated power of the external load 15 is canceled by the charge/discharge of the first storage battery 11 (and the second storage battery 21).

Incidentally, though the value of the target power supplied to the power system 30 can be fluctuated depending on a load flow state on the power system 30 side, the present embodiment illustrates a case in which the target power is substantially constant in terms of time.

The controller 14 (see FIG. 1) charges/discharges the first storage battery 11 in response to the power detected by the system power meter 13. That is, the controller 14 controls driving the first bidirectional inverter 12 so as to cause the first storage battery 11 to discharge an amount of shortage with respect to the target power Pt (for example, from time t1 to time t4) and cause the first storage battery 11 to charge an amount of surplus with respect to the target power Pt (for example, from time t4 to time t7).

FIG. 4B is a diagram showing waveforms of temporal changes in the charging/discharging power of the first storage battery and temporal changes in the charging/discharging electric power of the second storage battery. It is noted that a case is described in which, before time t1 in FIGS. 4A and 4B, only the first electricity storage system 10 charges and discharges, and when the second electricity storage system 20 is retrofitted at time t1, both the first storage battery 11 and the second storage battery 21 charge and discharge.

Before time t1, the charging/discharging power (broken line) of the first storage battery 11 shown in FIG. 4B varies to compensate for the amount of shortage/surplus of the generated power (dot and dash line) with respect to the target power Pt (solid line) shown in FIG. 4A.

In addition, after time t1, in response to the operation of the retrofitted second electricity storage system 20, the amount of power below the threshold Lim_D in the shortage/surplus described above is discharged from the second storage battery 21 (for example, from the time t2 to time t3), and the amount of power above the threshold Lim_C is charged to the second storage battery 21 (for example, from time t5 to time t6).

It is noted that the values of the thresholds Lim_C, Lim_D of the power correspond to the thresholds Lim_c, Lim_d of the current used in the above-mentioned calculator 23e for power command value (see FIG. 2).

As shown in FIG. 4B, the power supplied from the first electricity storage system 10 to the power system 30 is limited to fall in a range between the threshold Lim_D and the threshold Lim_C. This is because the detected value of the system power meter 13 varies minutely depending on the charge/discharge of the second storage battery 21 and the controller 14 controls driving the first bidirectional inverter 12 so as to cancel the variation.

Effect

According to the electricity storage system 1 of the present embodiment, the second bidirectional inverter 23 is set to charge the amount of power above the threshold Lim_C and to discharge the amount of power below the threshold Lim_D from the second storage battery 21. Since the detected value of the system power meter 31 varies minutely when the second storage battery 21 charges/discharges, the controller 14 controls driving the first bidirectional inverter 12 so as to cancel the variation to keep supplying the target power Pt in just proportion to the power system 30 precisely.

Then, the retrofitted second electricity storage system 20 limits the charging/discharging power of the first storage battery 11 to fall in the range between the threshold Lim_D and the threshold Lim_C (see the broken line in FIG. 4B), which can properly assist the shortage/surplus of the power by the first electricity storage system 10. Shortly, the existing first electricity storage system 10 and the retrofitted second electricity storage system 20 can continue to supply the predetermined target power Pt to the power system 30 (see the solid line in FIG. 4A).

It is noted that, by appropriately setting the values of the threshold Lim_c, Lim_d, a burden ratio of the charge/discharge of the first electricity storage system 10 and the charge/discharge of the second electricity storage system 20 can be changed.

Further, according to the present embodiment, when the second electricity storage system 20 is retrofitted, it is not necessary to modify the control algorithm for the controller 14 or to change the circuit structure of the first electricity storage system 10. Therefore, attachment and detachment operations when the second electricity storage system 20 is retrofitted can be simplified. Also, the second electricity storage system 20 can be retrofitted so as not to stop driving the first power storage system 10, which allows for continuously supplying the predetermined target power Pt to the power system 30 in a stable manner.

In addition, if the first storage battery 10 is formed with, for example, low responsive (self-supportive) batteries such as lead-acid batteries, a peak of the output power can be suppressed by the retrofitted second electricity storage system 20, to restrain the first storage battery 10 from being deteriorated. Thus, the higher responsive (highly instantaneous) battery can be retrofitted to the existing system having the lead-acid storage batteries to improve reliability in the entire system inclusive of, and to give a longer life than, the existing electricity storage system.

Second Embodiment

A second embodiment is different from the first embodiment in that a first electricity storage system 10A (see FIG. 5) includes a plurality of first storage batteries 111, 112 and a plurality of first bidirectional inverters 121, 122, but other points are the same as the first embodiment. Thus, the different points will be described but the same points as the first embodiment will not be described.

FIG. 5 is an entire structure diagram showing an overview of an electricity storage system according to the present embodiment. As shown in FIG. 5, the first electricity storage system 10A includes the first storage batteries 111, 112, the first bidirectional inverter 121, 122, the system power meter 13, the controller 14 and the external load 15.

The first bidirectional inverter 121 is connected to the first storage battery 111 on a DC side via the wiring a1, and is connected to the power system 30 on an AC side via the wiring a2 and a wiring c1. The first bidirectional inverter 122 is connected to the first storage battery 112 on a DC side via a wiring a4, and is connected to the power system 30 on an AC side via a wiring a5 and the wiring c1. The controller 14 drives the first bidirectional inverters 121 and 122 to control the charge/discharge of the first storage batteries 111, 112 such that the power detected by the system power meter 13 approaches the predetermined target power.

The second electricity storage system 20 includes the second storage battery 21, the current detector 22 and the second bidirectional inverter 23. The current detector 22 is arranged on the wiring a4 that connects the first storage battery 112 to the first bidirectional inverter 122, and outputs the value of the detected charging/discharging current to the second bidirectional inverter 23. The second bidirectional inverter 23 drives in response to the value of the charging/discharging current inputted from the current detector 22, and controls the charge/discharge of the second storage battery 21. It is noted that, since the operation of the second electricity storage system 20 is the same as that of the first embodiment, the description thereof will be omitted.

Effect

According to an electricity storage system 1A of the present embodiment, by retrofitting the second electricity storage system 20 to the existing first electricity storage system 10A, the second storage battery 21 can be charged and discharged such that the charging/discharging current Idc of the first storage batteries do not exceed the predetermined threshold (ie, Lim_d<Idc<Lim_c).

Therefore, even if the first electricity storage system 10A includes the plurality of first batteries 111, 112 and the first bidirectional inverters 121, 122, the second electricity storage system 21 can be retrofitted easily without changing the circuit structure of the first electricity storage system 10A and the control algorithm for the controller 14.

Third Embodiment

The third embodiment is different from the first embodiment in that a second electricity storage system 20B (see FIG. 6) includes a plurality of second storage batteries 211 to 213, current detectors 221 to 223 and second bidirectional inverters 231 to 233, but other points are the same as the first embodiment. Thus, the different points are described but the same points as the first embodiment will not be described.

FIG. 6 is an entire structure diagram showing an overview of an electricity storage system according to the present embodiment. As shown in FIG. 6, the second electricity storage system includes the second storage batteries 211 to 213, the current detectors 221 to 223 and the second bidirectional inverters 231 to 233.

The second bidirectional inverter 231 is connected to the second storage battery 211 on a DC side via the wiring b1, and is connected to the power system 30 on an AC side via the wirings b2, a2. It is noted that the second bidirectional inverters 231, 232 and 233 have the same structure as the second bidirectional inverter 23 as described in the first embodiment (see FIG. 2).

The current detector 221 (state detection device) is arranged on the wiring a1 that connects the first storage battery 11 to the first bidirectional inverter 12, and detects the charging/discharging current of the first storage battery 11 to output the result to the second bidirectional inverter 231. The second bidirectional inverter 231 controls the charge/discharge of the second storage battery in response to the charging/discharging current inputted from the current detector 221. It is noted that the operation of the second bidirectional inverter 231 is the same as that of the second bidirectional inverter 23 as described in the first embodiment.

The second bidirectional inverter 232 controls the charge/discharge of the second storage battery 212 based on the charging/discharging current of the second storage battery 211 detected by the current detector 222 (lower level state detection device). Similarly, the second bidirectional inverter 233 controls the charge/discharge of the second storage battery 213 based on the charging/discharging current of the second storage battery 212 detected by the current detector 223 (lower level state detection device).

It is noted that the structure and operation of the second bidirectional inverters 232, 233 are the same as those of the second bidirectional inverter 23 as described in the first embodiment (see FIG. 2).

Thus, in the present embodiment, a hierarchical structure is formed in which a plurality of pairs of a second storage battery and a second bidirectional inverter (including a control device) are arranged mutually in order, with a pair of storage battery 211 and the second bidirectional inverter 231 being the highest level.

The second bidirectional inverter 231 belonging to the highest level of pair is driven in response to the charging/discharging current of the first storage battery 11 detected by the current detector 221.

In addition, the second bidirectional inverter 232 (233) belonging to the second or lower level of pair is driven in response to the charging/discharging current, detected by the current detector 222 (223), of the second storage battery 211 (212) belonging to an upper level of pair by one level than the present pair.

It is noted that the threshold Lim_c for charging used in the calculators for power command value (corresponding to the calculator 23e for power command value shown in FIG. 2) included in the second bidirectional inverters 231, 232, 233 is appropriately set. Therefore, the first storage battery 11 and the second storage batteries 211, 212, 213 can share a fluctuation amount in the generated power by the external load 15.

Effect

According to an electricity storage system 1B of the present embodiment, a plurality of second storage batteries and the like can be retrofitted easily without changing the circuit structure of the first electricity storage system 20 and the control algorithm for the controller 14. In addition, with respect to the generated power by the external load 15, the first electricity storage battery and the three second electricity storage batteries 211, 212 and 213 can share compensating for the amount of shortage/surplus with respect to the target current.

Therefore, power can be continuously supplied to the power system 30 stably, while the burden of respective storage batteries being reduced.

Fourth Embodiment

The fourth embodiment is different from the first embodiment in terms of an installation point of a current detector 24 included in a second electricity storage system 20c (see FIG. 7) and a structure of the second bidirectional inverter 23, but other points are the same as the first embodiment. Therefore, the different points will be described and the same points as the first embodiment will not be described.

Figure 7:
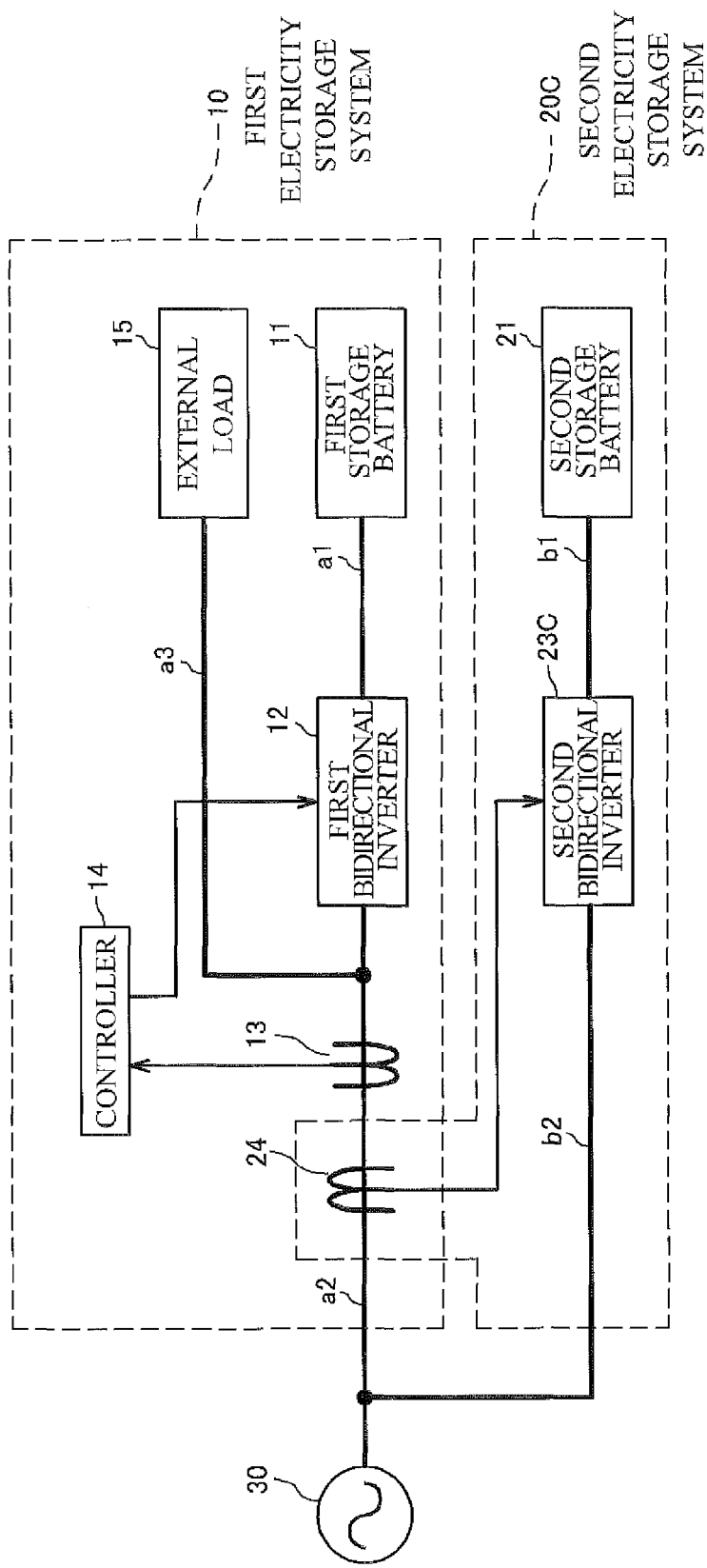
FIG. 7 is an entire structure diagram showing an overview of the electricity storage system according to a fourth embodiment of the present invention.

FIG. 7 is an entire structure diagram showing an overview of an electricity storage system according to the present embodiment. As shown in FIG. 7, on the wiring a2 that connects the power system 30 to the first bidirectional inverter 12, a current detector 24 (state detection device) is installed at a point closer to the power system 30 than a connection point on the wiring a3 with the first bidirectional inverter 12. The second bidirectional inverter 23C controls the charge/discharge of the second storage battery 21 in response to a current value inputted from the current detector 24.

Figure 8:
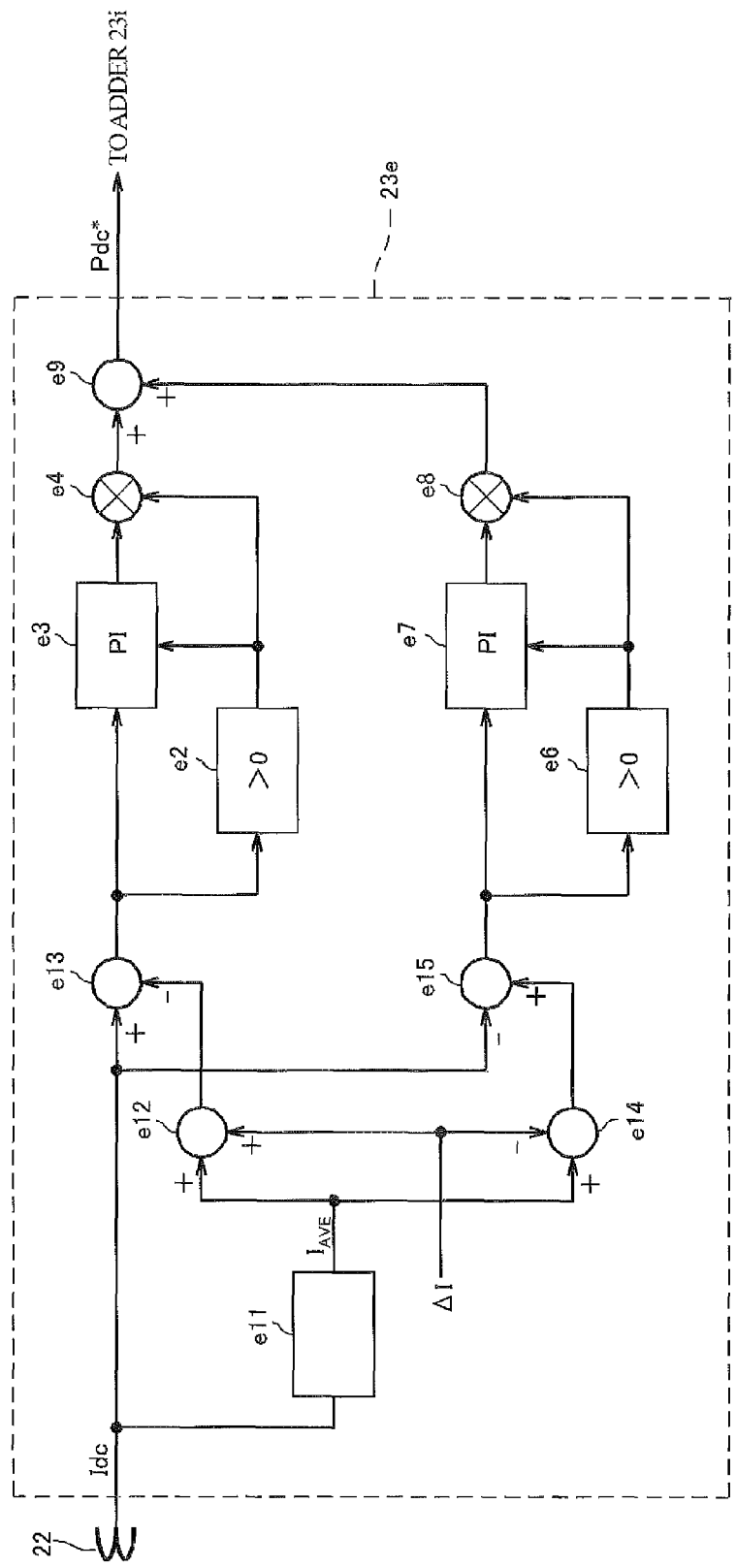
FIG. 8 is a structure diagram of a calculator for power command value included in a second bidirectional inverter.

It is noted that the structure of the second bidirectional inverter 23C is the same as that described in the first embodiment (see FIG. 2) except for the calculator 23e for current command value (see FIG. 8).

FIG. 8 is a structure diagram of the calculator for current command value included in the second bidirectional inverter. The calculator 23e for current command value includes a calculator e11 for average current value, adders e9, e12 to e15, the comparators e2, e6, the PI controllers e3, e7, and the multipliers e4, d8.

The calculator e11 for average current value executes a process of calculating an average value $I_{AVE}$ of the current Idc inputted from the current detector 22 in a predetermined cycle to output the result to the adders e12, e14.

The adder e12 adds a predetermined value $\Delta I$ (>0) to the average current value $I_{AVE}$ inputted from the calculator e11 for average current value to output the result to the adder e13. It is noted that the value of the predetermined value $\Delta I$ is preset to be stored in the storage device (not shown).

The adder e13 subtracts the output value of the adder e12 from the current Idc detected by the current detector 22 to output the result to the comparator e2 and the PI controller e3. That is, the adder e13 outputs the value obtained by adding the predetermined value $\Delta I$ to the fluctuation amount in current (Idc−$I_{AVE}$) to the comparator e2 and the PI controller e3.

The adder e14 subtracts the predetermined value $\Delta I$ (>0) from the average current value $I_{AVE}$ inputted from the calculator e11 for average current value to output the result to the adder e15. The adder e15 subtracts the detected value Idc by the current detector 22 from the output value of the adder e14 to output the result to the comparator e6 and the PI controller e7. That is, the adder e15 outputs the value obtained by adding a predetermined value (−$\Delta I$) to the fluctuation amount in current values ($I_{AVE}$−Idc) to the comparator e6 and the PI controller e7.

It is noted that operations of the comparators e2, e6, the PI controllers e3, e7, the multipliers e4, e8 and the adder e9 shown in FIG. 8 are the same as those described in the first embodiment (see FIG. 3) and descriptions thereof will be omitted.

In other words, if the value of the current difference (Idc−$I_{AVE}$) is out of a range between (−ΔI) and ΔI, the calculator 23e for power command value calculates the power command value Pdc* according to the current difference to output the result to the adder 23i (see FIG. 2).

Thus, in the present embodiment, with respect to the amount of the fluctuations in the generated power by the external load 15, the second storage system 20C is configured to assist the first electricity storage system 10 to compensate for the amount beyond the capability of the first electricity storage system 10.

Incidentally, if the detected current value Idc is between the threshold (−ΔI) and the threshold ΔI, outputs of both the comparators e2, e6 are zero, causing the current command value Pdc* outputted from the adder e9 also to become zero. That is, the threshold ΔI is set to prevent the charge/discharge of the second storage battery 21 from occurring too frequently (in other words, to set a dead zone).

Figure 9A:
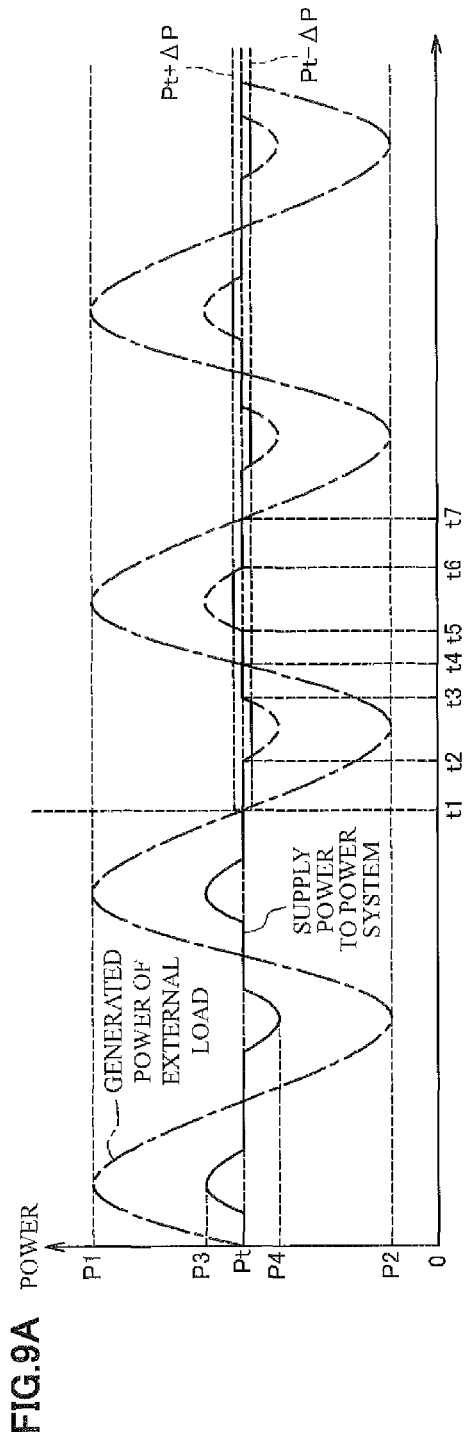
FIG. 9A is a diagram showing waveforms of temporal changes in a total amount of power supplied to a power system and temporal changes in power outputted from an external load.

FIG. 9A is a diagram showing waveforms of temporal changes in a total amount of power supplied to the power system and temporal changes in power outputted from the external load. It is noted that, before time t1 shown in FIGS. 9A and 9B, only the first electricity storage system 10 is charged and discharged, and when the second electricity storage system 20 is retrofitted at time t1, both the first storage battery 11 and the second storage battery 21 are charged and discharged.

Before time t1, only the charge/discharge of the first storage battery 11 cannot compensate for the fluctuation amount in the generated power from the external load 15 (see a broken line in FIG. 9B), and the values of the charging/discharging power level off at powers P5, P6. For example, among the fluctuation amount (P1-Pt) in the generated power of the external load 15 (see FIG. 9A), only the charge of the first storage battery 11 cannot compensate for a range above the power P5, and the value of supply power to the power system 30 fluctuates in a range between power P4 and power P3 (see a solid line in FIG. 9A).

Figure 9B:
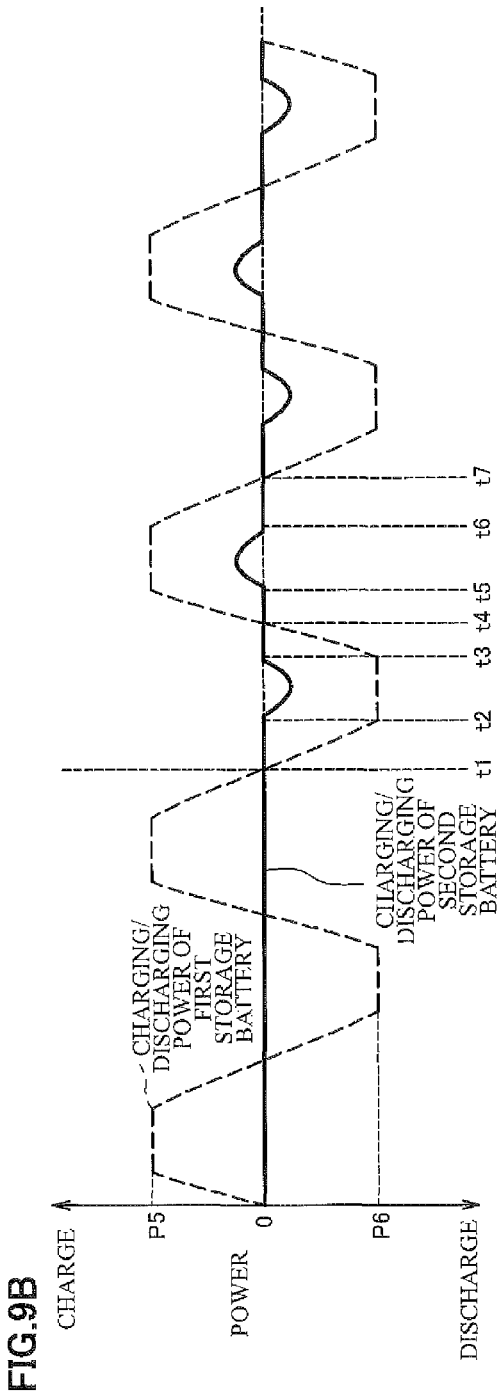
FIG. 9B is a diagram showing waveforms of temporal changes in charging/discharging power of a first storage battery and temporal changes in charging/discharging power of a second storage battery.

When the second electricity storage system 20C is retrofitted after time t1 shown in FIG. 9B, the second bidirectional inverter 23C is driven to control the charge/discharge of the second storage battery 21 such that the fluctuations in the current values (that is, the fluctuation amount that cannot be compensated only by the first storage battery 21) inputted from the current detector 24 are canceled out.

As a result, for example, from time t2 to time t3, the second storage battery 21 is discharged with the power that is short only from the first electricity storage system 10 (see the solid line in FIG. 9B). In addition, from time t5 to time t6, the second storage battery 21 is charged with the power that is surplus only to the first electricity storage system 10.

As described above, if a current value $P_S$ inputted from the current detector 24 is between the threshold (−ΔI) and the threshold (ΔI), the second bidirectional inverter 34C set the power command value Pdc* to zero. Since such a dead zone is provided, after time t1 shown in FIG. 9A, the power that is substantially equal to the target power Pt is supplied to the power system 30 while minute fluctuations ΔP associated with ΔI are repeated.

Effect

According to an electricity storage system 1C of the present embodiment, if only the charge/discharge by the first electricity storage system 10 cannot compensate for the power fluctuations of the external load 15 due to deterioration of the existing first storage battery 11 or the like, power can be supplied to the power system 30 stably by retrofitting the second electricity storage system 20C.

Also, if the detected current value Idc is between the threshold (−ΔI) and the threshold (ΔI), the calculator 23e for power command value sets the power command value Pdc* to zero. With such a dead zone, the second storage battery 21 can be prevented from repeating the charge/discharge for minute power fluctuations, to allow for a long usage.

Fifth Embodiment

A fifth embodiment is different from the first embodiment in that a second electricity system 20D (see FIG. 10) includes a plurality of second storage batteries 215 to 217, second bidirectional inverters 235 to 237, and a plurality of current detectors 245 to 247 for detecting the current on the power system 30 side, but other points are the same as the fourth embodiment. Thus, the different point will be described and the same points as the fourth embodiment will not be described.

Figure 10:
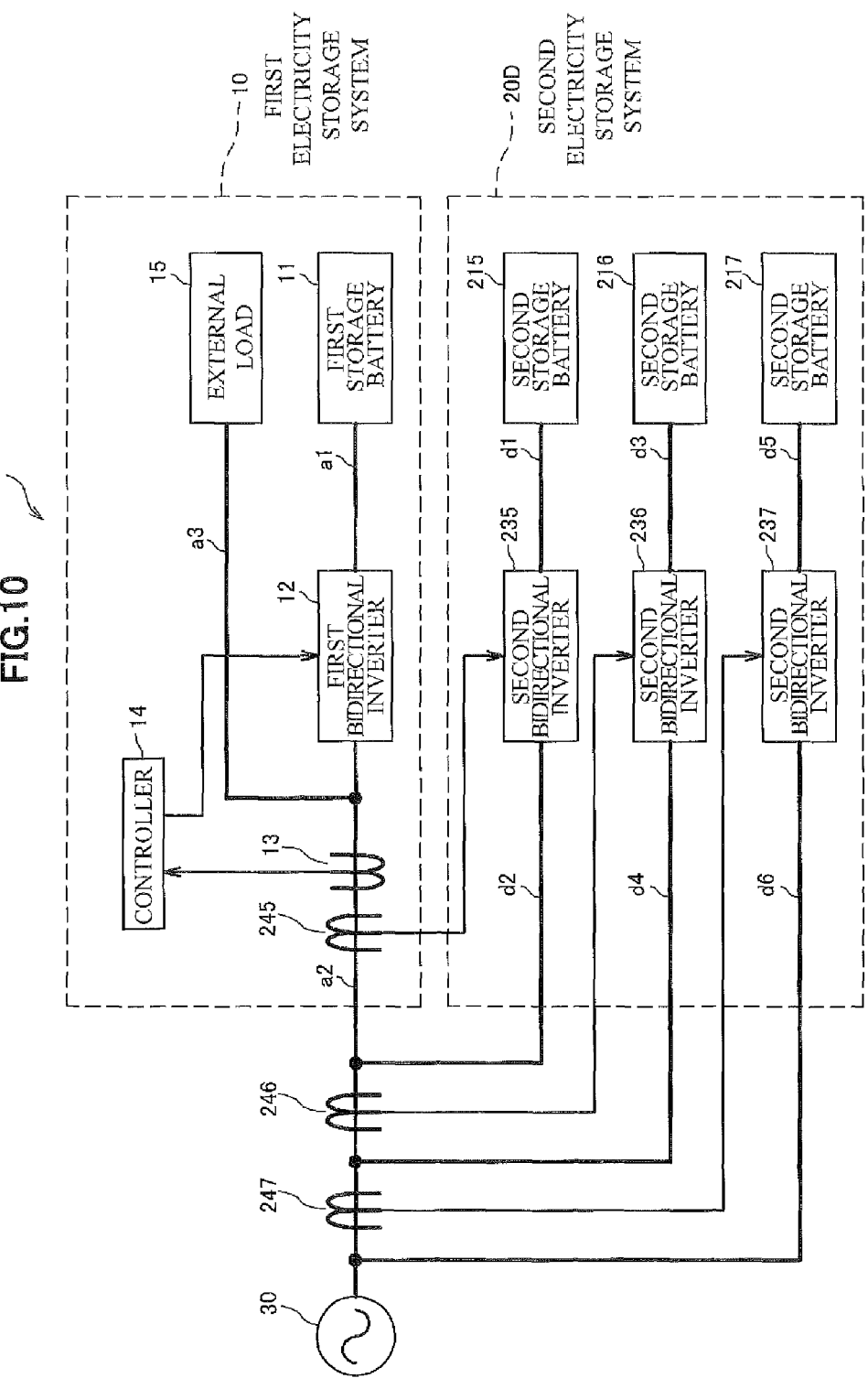
FIG. 10 is an entire structure diagram showing an overview of the electricity storage system according to a fifth embodiment of the present invention.

FIG. 10 is an entire structure diagram showing an overview of an electricity storage system according to the present embodiment. As shown in FIG. 10, the second electricity storage system 20D includes the second storage batteries 215 to 217, the second directional inverters 235 to 237, and the current detectors 245 to 247.

The current detector 245 (state detection device) is arranged at a point closer to the power system 30 than a connection point between the wiring a2 that connects the first bidirectional inverter 12 to the power system 30 and the wiring a3 one end of which is connected to the external load 15.

The second bidirectional inverter 235 is connected on a DC side to the second storage battery 215 via the wiring d1, and is connected on an AC side to the wiring a2 at a point closer to the power system 30 than the current detector 245 via a wiring d2. The second bidirectional inverter 235 controls the charge/discharge of the second storage battery 215 so as to cancel a fluctuation amount of current inputted from the current detector 245. It is noted that the structures and operations of the second bidirectional inverters 235, 236, 237 are the same as those of the second bidirectional inverter 23C described in the fourth embodiment (see FIG. 8).

The current detector 246 (lower level state detection device) is installed on the wiring a2 at a point closer to the power system 30 than a connection point between the second bidirectional inverter 235 and the wiring a2. The second bidirectional inverter 236 is connected on a DC side to the second storage battery 216 via a wiring d3, and is connected on an AC side to the wiring a2 at a point closer to the power system 30 than a point closer to the current detector 246 via a wiring d4.

A current detector 247 (lower level state detection device) is installed on the wiring a2 at a point closer to the power system 30 than a connection point between the second bidirectional inverter 236 and the wiring a2. The second bidirectional inverter 237 is connected on a DC side to the second storage battery 217 via the wiring d5, and is connected on an AC side to the wiring a2 at a point closer to the power system 30 than the current detector 247 via a wiring d6.

Respective second bidirectional inverters 235 to 237 share the fluctuations of the generated power by the external load 15 to compensate for the amount of power which the first electricity system 10 cannot compensate, by the charge/discharge of the second storage batteries 215 to 217, to level the power supplied to the power system 30.

It is noted that the value of the threshold ΔI can be appropriately set in calculators for power command value included in the second bidirectional inverters 235 to 237 (corresponding to the calculator 23e for power command value shown in FIG. 8) so that the charge/discharge as described above is properly shared among and is performed by the second storage batteries 215 to 217.

Thus, in the present embodiment, a hierarchical structure is formed in which a plurality of pairs of a second storage battery and a second bidirectional inverter (including a control device) are arranged mutually in order, with a pair of the second storage battery 215 and the second bidirectional inverter 235 being the highest level.

In addition, the charging/discharging current of the first storage battery 11 is indirectly detected by the current detector 245 (state detection device), and for example, the charging/discharging current of the second storage battery 215 is indirectly detected by the current detector 246 (lower level state detection device).

The second bidirectional inverter 235 belonging to the highest level of pair is driven in response to the charging/discharging current of the first storage battery 11 detected by the current detector 245. Further, the second bidirectional inverter 236 (237) belonging to the second or lower level of pair is driven in response to the current value inputted from the current detector 246 (247).

Effect

According to an electricity storage system 1D of the present embodiment, if only the charge/discharge by the first electricity system 10 cannot compensate for the power fluctuations of the external load 15 due to deterioration of the existing first storage battery 11 or the like, power can be supplied to the power system 30 stably by retrofitting the second electricity system 20D including the plurality of second storage batteries 215 to 217 and the like.

In addition, the fluctuation amount in the generated power by the external load 15 is shared to compensate between the first battery 11 and the three second storage batteries 215 to 217. Therefore, the burden of each storage battery is reduced and each battery can be used for a long time.

Modification

Hereinabove, the electricity storage system 1 and the like according to the present invention have been described in detail with reference to the drawings, but the present invention is not limited to these embodiments and can be modified appropriately without departing from the spirit of the invention.

For example, in the first embodiment, a case is described in which the second bidirectional inverter 23 controls the charge/discharge of the second storage battery 21 based on the current value detected by the current detector 22 installed on the wiring a1, but the invention is not limited thereto. In other words, a power detector may be arranged on the wiring a1 instead of the current detector, and the second bidirectional inverter 23 may control the charge/discharge of the second storage battery 21 based on power detected by the power detector. Even in this case, the same effect can be obtained as the first embodiment.

In addition, the same can be applied to the second to fifth embodiments.

Further, in each embodiment, the external load 15 has been described as a generator, but it is not limited thereto.

Shortly, the external load 15 may be an electrical device that consumes power supplied from the power system 30.

Still further, the external load 15 may be omitted. In this case, for example, during a time zone (night time) when the load on the demand side is small, respective bidirectional inverters 12, 23 may function as converters to charge respective storage batteries 11, 21, with the power from the power system 30, and during a time zone (daytime) when the load on the demand side is large, respective bidirectional inverters 12, 23 may function as inverters to discharge respective storage batteries 11, 21.

Still further, in each embodiment, a case has been described in which the existing first storage battery 11 includes lead-acid batteries and the retrofitted second storage battery 21 includes lithium ion batteries, but the invention is not limited thereto. For example, both the first storage battery 11 and the second storage battery 21 may be lithium ion batteries. Also, various batteries such as nickel-cadmium storage batteries, redox flow batteries can be used as the first battery 11 or the second battery 21.

Still further, the processing executed by the calculator 23e for power command value included in the second bidirectional inverter 23 is not limited to the structure as shown in FIG. 3. That is, if an absolute value of the detected current value Idc exceeds the preset threshold, the calculator 23e for power command value may have other structures as long as the calculator 23e compensates for the amount exceeding the preset threshold by charging and discharging the second storage battery.

Still further, in each embodiment, a case has been described in which the first storage battery 11 and the second storage battery 21 are formed by connecting a plurality of cells in series, but the invention is not limited thereto. For example, a large number of cells may be connected in series and in parallel to constitute the first storage battery 11 and/or the second storage battery 21 and a battery management device may manage states of respective cells in a hierarchical manner. In this case, battery information (a voltage value, a current value, temperature, and a charging state etc. of the second storage battery) obtained by the battery management device may be configured to be outputted to the second bidirectional inverter 23, and the values of the thresholds Lim_c, Lim_d may be adjusted in response to the battery information as described above.

Yet further, a DC current sensors such as Hall elements having split cores may be used as the current detectors 22, 24 (see FIGS. 1 and 7). With the split cores, the DC current sensors can be attached/detached to/from the wirings contactlessly and the current of the second storage battery 21 can be measured contactlessly. Therefore, the second storage system 20 can be retrofitted safely and easily.

EXPLANATION OF REFERENCES 1, 1A, 1B, 1C, 1D: electricity storage system
10: first electricity storage system (another electricity storage system)
11, 111, 112: first storage battery
12, 121, 122: first bidirectional inverter
13: system power meter
14: controller
15: external load
20, 20B, 20C, 20D: second electricity storage system (electricity storage system)
21, 211, 212, 213, 215, 216, 217: second storage battery (storage battery)
22, 221, 24, 245: current detector (stage detection device)

222, 223, 246, 247: current detector (lower level state detection device)
23, 231, 232, 233, 23C, 235, 236, 237: second bidirectional inverter (bidirectional inverter)
23*a*: inverter circuit (bidirectional inverter)
23*e*: calculator for power command value (control device)
23*h*: calculator for charging/discharging power (control device)
23*j*: PI controller (control device)
23*k*: extractor for AC voltage information (control device)
23*n*: calculator for effective current (control device)
23*r*: PI controller (control device)
23*t*: three-phase PWM controller (control device)
30: power system

The invention claimed is:

1. An electricity storage system comprising:
    a state detection device that detects directly or indirectly a charging/discharging current or charging/discharging power of another electricity storage system connected to a power system;
    a bidirectional inverter that performs power conversion when charge/discharge of a storage battery managed by the electricity storage system is performed from/to the power system; and
    a control device that controls driving the bidirectional inverter so as to compensate for charging/discharging the other electricity storage system in response to the charging/discharging current or the charging/discharging power detected by the state detection device, wherein
    the state detection device is installed on wiring at a position closer to the power system than a connection point between an external load that generates or consumes power to/from the power system and the other electricity storage system, and
    the control device calculates an average value of current or power detected by the state detection device in a predetermined cycle, and controls driving the bidirectional inverter so as to cancel a difference if an absolute value of the difference between the current or the power and the average value exceeds a predetermined threshold.

2. The electricity storage system according to claim 1, wherein
    a plurality of sets of the storage battery, the bidirectional inverter and the control device are arranged mutually in order,
    a lower level state detection device is installed between connection points of the two bidirectional inverters in adjacent sets and the power system, and detects current or power at the points to output the detected result to the control device belonging to a lower set in the adjacent sets,
    the state detection device is arranged between a connection point of the bidirectional inverter in the highest level of set and the power system and a connection point of the other electricity storage system and the power system,
    the control device belonging to the highest level of set controls driving the bidirectional inverter belonging to the highest level of set in response to current or power detected by the state detection device, and
    the control device belonging to the second or lower level of set controls driving the bidirectional inverter belonging to the second or lower level of set in response to current or power inputted from the lower level state detection device.

3. The electricity storage system according to claim 1, wherein
    the storage battery managed by the electricity storage system has a higher output/capacity ratio than the storage battery managed by the other electricity storage system.

4. The electricity storage system according to claim 1, wherein
    the state detection device can be attached/detached to/from a wiring contactlessly.

* * * * *